United States Patent [19]

Nathan

[11] 4,365,219

[45] Dec. 21, 1982

[54] IN-LINE SURFACE ACOUSTIC WAVE FILTER ASSEMBLY MODULE AND METHOD OF MAKING SAME

[75] Inventor: Bernard D. Nathan, Liverpool, N.Y.

[73] Assignee: General Electric Company, Lynchburg, Va.

[21] Appl. No.: 238,758

[22] Filed: Feb. 27, 1981

[51] Int. Cl.$^3$ .................... H03H 9/64; H03H 9/05; H03H 9/25
[52] U.S. Cl. .................... 333/193; 333/154; 333/194; 29/25.35
[58] Field of Search ............. 333/150–155, 333/193–196; 310/313 R, 313 A, 313 B, 313 C, 313 D, 366, 346; 331/107 A; 29/25.35

[56] References Cited

U.S. PATENT DOCUMENTS

| | | | |
|---|---|---|---|
| 3,573,673 | 4/1971 | De Vries et al. | 333/194 |
| 3,688,223 | 8/1972 | Pratt et al. | 333/194 |
| 3,828,210 | 8/1974 | Livenick et al. | 310/346 |
| 3,872,331 | 3/1975 | Falco | 333/150 X |
| 4,044,321 | 8/1977 | Vasile | 333/194 |
| 4,126,839 | 11/1978 | Yamanoi et al. | 333/194 |

*Primary Examiner*—Marvin L. Nussbaum
*Attorney, Agent, or Firm*—James J. Williams

[57] ABSTRACT

A SAW filter assembly module comprising a plurality of series in-line SAW filter devices and effective to provide substantial isolation of output from input of the module. Separate isolated conductive ground areas are applied to the surface of an insulative substrate upon which the SAW filter devices are placed with a portion of certain areas extending to a terminal side of the substrate and each SAW device is electrically connected to a respective conductive ground area. A separate inter-SAW ground area is provided between each set of device ground areas. A conductive input area of a first SAW filter is located most distant from the conductive output area of a subsequent SAW filter with the plurality of conductive ground areas located therebetween to increase selectivity. A conductive shield is secured to and electrically connected to a ground area between the SAW filter devices and is positioned to block radiative signals between the devices. A shunt inductor is connected between the inter-SAW ground area and in inter-SAW signal path conductive area to increase selectivity with low insertion loss. Bent wire straps, of flat or other essentially non-cylindrical cross-section may be used to make electrical connections between the electrodes of the transducers of each SAW to the appropriate respective conductive areas of the substrate. An insulative cover is positioned over the filter assembly module with portions of the conductive areas extending thereunder toward the terminal side of the substrate.

10 Claims, 2 Drawing Figures

IN-LINE SURFACE ACOUSTIC WAVE FILTER ASSEMBLY MODULE AND METHOD OF MAKING SAME

This invention relates to semiconductor packaging structures and methods, and more particularly to new and improved semiconductor packaging structures and methods for packaging a plurality of surface acoustic wave filters in an in-line configuration comprising a filter assembly module effective to increase frequency selectivity in communications equipment.

BACKGROUND OF THE INVENTION

The elimination of crosstalk is an important objective in communications receivers. Basically, all frequencies outside of the narrow band of frequencies of interest are considered noise that degrades the signal information value of the communication. One type of bandpass filter in use today is the surface acoustic wave resonator filter which operates on the principles of piezoelectricity. The conventional prior art structure of a surface acoustic wave (SAW) filter comprises an insulative substrate sometimes having at least one conductively coated surface area ("earth pattern") upon which a surface acoustic wave element is mounted. The surface acoustic wave element comprises a surface acoustic wave propagating medium such as a piezoelectric substrate (e.g., $LiNbO_3$, St-cut Quartz), an input electrode pair which consists usually of a pair of comb-shaped electrodes, both of which are mounted on the piezoelectric substrate, and an output electrode pair which also consist usually of a pair of comb-shaped electrodes both of which are mounted on the surface of the piezoelectric substrate. Each electrode pair is comprised of a plurality of elongated parallel electrically connected teeth or fingers with the fingers of one electrode interdigitized in predetermined spaced relation with the fingers of the other electrode. Such electrodes are usually formed of a conductive material, which may be vacuum deposited on a polished planar surface of the piezoelectric substrate. The conductive fingers cooperate as electrodes with the piezoelectric material thereunder, and each pair of interdigitized comb-shaped electrodes cooperate with the piezoelectric substrate to serve as an electroacoustic transducer. As an electrical signal is applied between the interdigitized electrodes of the input electrode pair transducer, surface waves are set up and propagate to the output electrode pair which becomes an output transducer which develops a voltage between its comb-shaped electrodes. In general, such devices have inherent frequency response centered at a frequency determined by the center-to-center spacing of the interdigitized fingers of each of the transducers. For example, in a television IF embodiment disclosed in U.S. Pat. No. 3,573,673 DeVries et al, utilizing PZT as the piezoelectric substrate, the fingers of both the input transducer and the output transducer are approximately 0.5 mil wide and are separated by 0.5 mil for the application of an IF signal in the typical range of 40 to 46 megahertz. The spacing between the input transducer and the output transducer is approximately 60 mils and the width of the wavefront is approximately 0.1 inch. This structure can be compared to a cascade of two tuned circuits the resonant frequency of which is determined largely by the spacing of the fingers.

Crosstalk results when a signal is directly transmitted from the input transducer to the output transducer without the time delay required for a wave introduced by the input transducer to reach the output transducer. As a result, two sets of signals from the input are transmitted to the output, one of which is delayed in time relative to the other, resulting in crosstalk. Crosstalk is partially caused by capacitive coupling between the input and output transducers. Reducing such coupling by increasing the spacing between transducers is undesirable due to the resultant increased wave attenuation associated with the larger wave path distance.

Another source of crosstalk is bulk waves produced concurrently in the piezeoelectric with the desired surface waves. Such bulk waves travel through the piezoelectric at a different velocity and through a different path than the surface wave. It is known in the prior art that bulk wave effects can be reduced by increasing the thickness of the piezoelectric substrate. Also known is the fact that filter selectivity can be increased by increasing the number of teeth in the combs of the electrodes. However, this also increases capacitive coupling as does increasing the width of the fingers of each comb. U.S. Pat. No. 3,573,673, DeVries et al, discloses the use of maximal distance separation such that the input electrode having signal content is closer to the output ground electrode than the output signal electrode, since the potential induced on one electrode by another is reduced as the spacing is increased, and also since field intensity decreases as the distance between electrodes increases. The signal electrodes are maximally spaced apart while the ground electrodes of input and output are closely spaced. In addition, vertical wall shields between input and output electrode pairs of a *single* SAW filter are disclosed.

In U.S. Pat. No. 4,126,839, Yamanoi et al, an earth ground pattern is disclosed as separated between the signal input and signal output points in order to reduce the cause of the inductive and capacitive couplings between the signal input and signal output of a SAW filter. Wire leads connect the ground electrodes of the input and output to the earth pattern.

In order to obtain the selectivity required for many communication products, it is necessary to use at least two SAW resonator filters. Coupling occurs between input and output leads in many configurations which allows unwanted frequencies to pass, thereby degrading filter performance. Conventional solutions to this problem involve packaging the filter separately which is presently expensive and bulky. At high frequencies the inductance of leads to a ground plane becomes significant and the floating ground plane can carry the undesired signal from the input to the output, thereby degrading the effectiveness of the SAW filter.

The use of bent wire bonds to connect the printed conductive patterns on the ceramic substrate to the surface of a piezoelectric for the purpose of reducing temperature effects or corresponding frequency response and allowing crystal expansion and contraction is well known, as disclosed for example, in U.S. Pat. No. 3,828,210, Livenick.

OBJECTS OF THE INVENTION

An object of the present invention is to provide new and improved surface acoustic wave apparatus including crosstalk reduction means that are fully compatible with integrated circuit techniques.

Another object of the present invention is to reduce the effects of a floating common ground carrying an unwanted signal from the input signal electrode of a first in-line SAW resonator filter to the output signal electrode of a later stage SAW resonator filter.

Another object of the present invention is to provide a new and improved filter assembly module including means to reduce crosstalk from input to output leads in a series or "in-line" arrangement of a plurality of surface acoustic wave filters contained therein.

Another object of the prevent invention is to provide a high selectivity multi-stage SAW filter assembly module of small size and low cost.

Another object of the present invention is to provide a low cost method for packaging multiple in-line SAW filters.

Another object of the present invention is to provide a high selectivity filtering apparatus suitable for being readily produced by automated manufacture and assembly techniques.

Still another object of the present invention is to provide a new and improved selective circuit device adapted for convenient electrical and mechanical interfacing with external circuit devices.

SUMMARY OF THE INVENTION

The foregoing and other objects of the present invention are achieved with a structure and packaging method for a surface acoustic wave (SAW) filter assembly module comprising a plurality of in-line SAW filters to provide substantial isolation of output from input.

Electrically conductive material is applied in a pattern comprising a plurality of discrete mutually isolated areas on a surface of an insulative substrate having oppositely disposed input and output ends and oppositely disposed terminal and non-terminal sides. One area is associated with the input signal to the first SAW filter and is located closest to the input end and adjacent the terminal side. A ground area associated with the first SAW filter is located next closest to the input end and adjacent the terminal side. Similarly, an area associated with the output of the filter assembly module is located closest to the output end and adjacent the terminal side. A ground associated with the latter SAW filter is located next closest to the output end and adjacent the terminal side. A separate third ground area is located between the first two conductive ground areas (inter-SAW ground area) and has a portion which is adjacent the terminal side. A signal path conductive area is located between the third ground area and the non-terminal side of the surface and includes oppositely disposed input and output portions and an intermediate portion. Thus, the conductive input area of the first SAW filter is most distant from the conductive output area of the later SAW filter with three conductive ground areas located therebetween to increase selectivity. A first SAW filter device is placed over and secured to a portion of the conductive material on each of the signal and ground areas associated with the first SAW filter and a second SAW filter device is placed over and secured to a portion of the signal and ground areas associated with the latter SAW filter. Electrical connections are made between each of the electrodes of each of the SAW filters and the appropriate conductive areas on the substrate. For example, the output electrode of the first SAW filter is connected to the input portion of the signal path conductive area and the input electrode of the later SAW filter is connected to the output portion of the signal path conductive area.

Bent wire straps, preferably of flat or other essentially non-cylindrical cross-section may be used to make the electrical connections. The bends allow for motion resulting from temperature changes and the flat or non-cylindrical cross-section results in less radiation than with a cylindrical or essentially cylindrical cross-section. For similar reasons, ribbon wirebonding might be suitable.

An inductor is electrically connected between the signal path conductive area and the third ground area to increase the selectivity of the filter assembly module with low insertion loss. Additionally, a metal shield may be secured and electrically connected to the third conductive area between the SAW filter devices and is positioned to block radiative signals between the devices.

Portions of the conductive areas extend to the terminal side and thereby provide convenient contact points. An insulative cover can be placed over the filter assembly module with the cover not extending over the entire terminal side of the substrate. In this manner, convenient contact areas are provided with the electrical components such as the SAW filter devices themselves protected by the cover. By first mechanically attaching the metallic shield to the inside of the cover, the shield and cover can both be simultaneously secured to the substrate with the shield being additionally electrically connected to the third ground area all in a single automated manufacturing operation.

DESCRIPTION OF THE DRAWING

The organization and manner of operation of the invention, together with further objects and advantages thereof, may best be understood by reference to the following description taken in conjunction with the accompanying drawing in the several figures of which like reference numerals identify like elements.

DETAILED DESCRIPTION

The present invention involves both the method of making as well as the apparatus for increasing frequency selectively and isolation for a plurality of series connected in-line surface acoustic wave filters in a filter assembly module which can be inexpensively manufactured, preferably by automated machinery. The resultant apparatus is effective for providing convenient electric interfacing with other associated circuitry. For convenience of illustration and description only, a two stage surface acoustic wave (SAW) filter assembly module comprising two in-line SAW filter devices is disclosed. However, it is to be understood that the invention applies to any plurality of in-line SAW filters.

Figure 1:
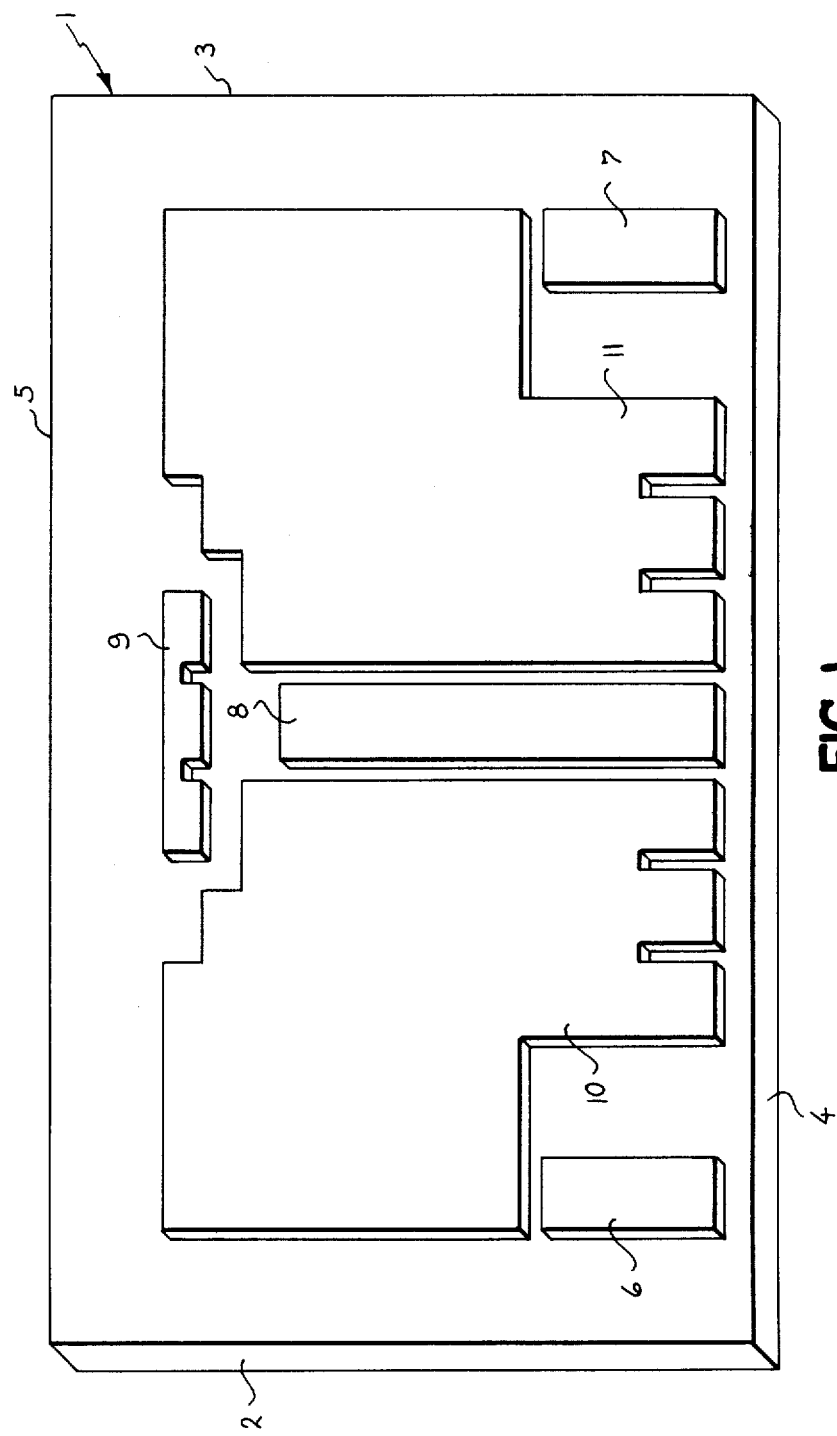
FIG. 1 is a plan view of a ceramic substrate comprising a component of the invention and having a pattern of conductive areas applied thereon.

In FIG. 1 is shown an insulative substrate 1, preferaby a ceramic substrate of the type normally used in hybrid microelectronics, to which a metallization pattern is applied. The substrate 1 includes a surface having an input end 2, an output end 3, a terminal side 4, and a non-terminal side 5. The metallization pattern comprises, in this two-SAWs case, six separate non-touching, or mutually electrically isolated, electrically conductive areas printed or coated onto the surface of the substrate. The conductive material can be a metallic deposition or coating applied by any one of various well known techniques. A first conductive area 6 comprises an input signal area which is located most closely adjacent both the input end of the substrate surface and the terminal side relative to all of the conductive areas, and which includes a portion extending toward and close to the terminal side of the surface. A second area 7 comprises an output signal area which is located most closely adjacent both the output end of the substrate surface and the terminal side, and which includes a portion extending toward and close to the terminal side of the surface. A third area 8 is an inter-SAW ground shield area which is located between the first area 6 and the second area 7, and which includes a portion extending close to the terminal side of the surface but not to the non-terminal side. A fourth area 9 is an inter-SAW signal path conductive area which is located between the third area 8 and the non-terminal side of the surface, and which includes oppositely disposed input and output portions and an intermediate portion. In general, the fourth area 9 is positioned between the first area 6 and the second area 7 and extends close to the non-terminal side 5 of the surface but not to the terminal side. As shown in FIG. 1, the ground shield area 8 and signal path area 9 may block each other from extending to the other side of the surface. A fifth area 10 is an input ground area which is disposed between the input signal area 6 and ground shield area 8, and which has a portion which extends close to the terminal side of the surface. A sixth area 11 is an output ground area which is disposed between the output signal area 7 and ground shield area 8, and which has a portion which extends close to the terminal side of the surface. All of these conductive areas but fourth area 9 have a portion which extends on the terminal side 4 of the surface of the substrate outside beyond where a cover over the plurality of SAW filters and associated electrical connections and components would be placed. Increased electrical isolation between filter devices mounted on the substrate is achieved by means of separate filter grounds and the separate third ground area 8 disposed therebetween. Additionally, the conductive input area 6 of the first SAW filter device is most distant from the conductive output area 7 of the next stage SAW filter device with the three separate conductive ground areas 10, 8, 11 placed therebetween for increased selectivity. These conductive areas may be produced by a standard printed conductor technique.

Typically, the SAW filter device in a structure of the presently disclosed type includes on the side thereof opposite the substrate, an input transducer and an output transducer, each comprising two comb-like arrays wherein the conductive fingers of one comb are interleaved or interdigitized with the fingers of the other. Each interdigitized set of conductive fingers comprises an electrode. Such electrodes are usually formed of a conductive metal such as aluminum which may be vacuum-deposited on the planar surface of the piezoelectric body of the SAW filter device. The input transducer electrode pair comprises the input signal electrode and the input ground electrode. The output transducer of the SAW filter device comprises the output signal electrode and the output ground electrode.

The term "surface acoustic wave filter device" in this invention is meant to include SAW resonators as well as transversal filters. The SAW resonator device also includes a pair of reflecting gratings (periodic disturbances of the surface, such as etched grooves or metallized lines) flanking the transducer pair described above.

Figure 2:
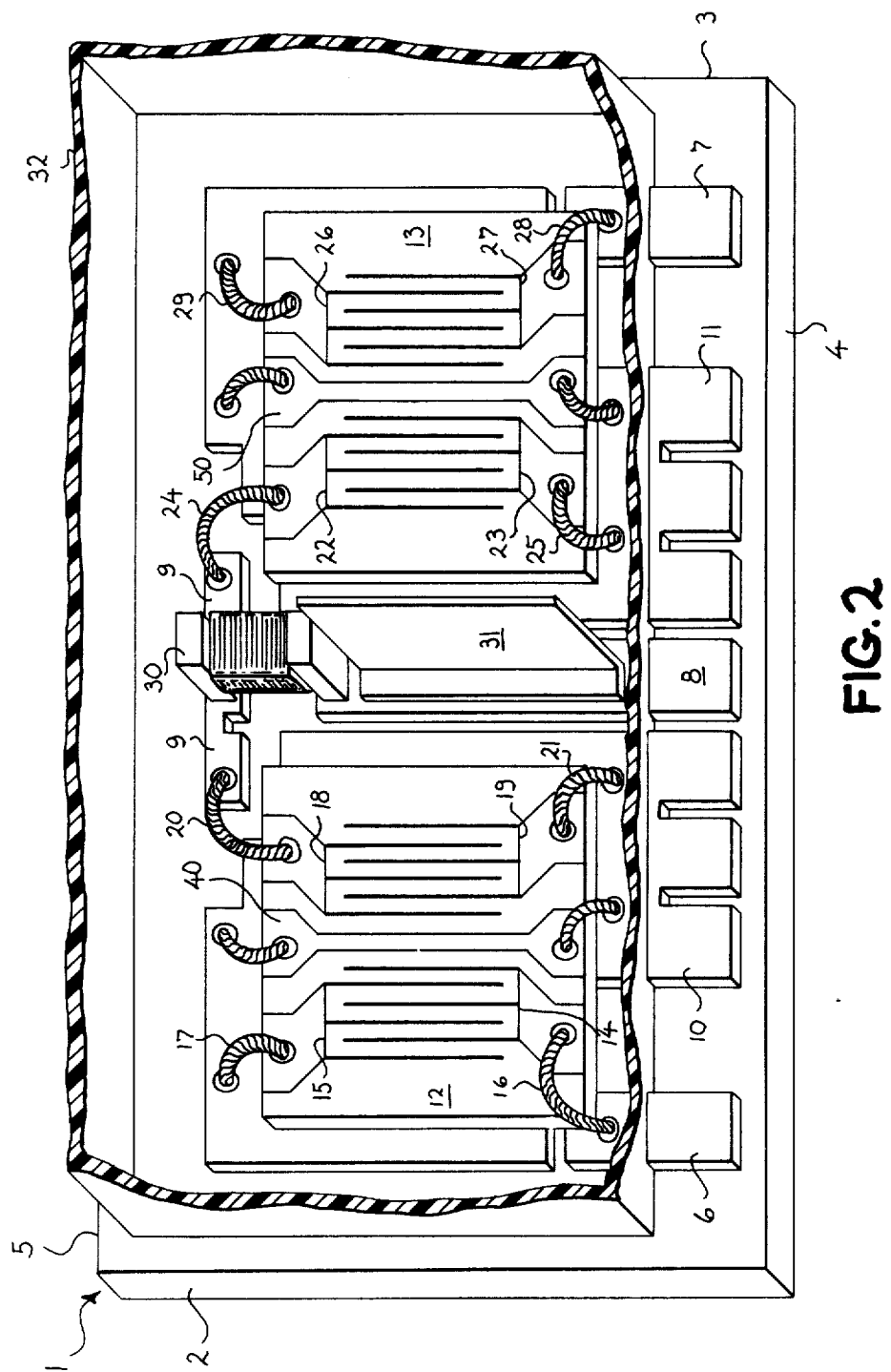
FIG. 2 is a partly schematic perspective view of the invention incorporating the substrate structure of FIG. 1.

More specifically, and as shown in FIG. 2, a first surface acoustic wave (SAW) filter device 12 is positioned over and secured to a portion of input signal area 6 and a portion of input ground area 10, such that the input signal electrode 14 of an input transducer, constituted of input signal electrode 14 and input ground electrode 15, of the first SAW filter device is disposed closer to the input signal area 6 than the output transducer of the same filter device. Although not shown in FIG. 2, the SAW resonators would also include reflecting gratings flanking the input and output transducer pairs. The mechanical securing of the device can be effected by means of a non-conductive adhesive of a type which is effective for reducing reflection of bulk waves from the rear surface of the piezoelectric crystal, is insensitive to the high heat requirements of cover sealing, and additionally provides low outgassing. The adhesive used here in attempting to achieve this purpose is "Microstop," available from Michigan Chrome & Chemical Co., Detroit, Mich. The output signal electrode 18 and output ground electrode 19 of the output transducer of this SAW filter device is disposed closer to the input portion of the signal path area 9 than the electrodes of the above-mentioned input transducer of this SAW device. A device ground shield 40, comprising a strip or array of strips of conductive material going across the entire top surface of the piezoelectric may be located so as to be between and thereby separate the transducers of this SAW filter device and may be electrically connected to the fifth area (input ground area) 10, at both sides of this device ground shield.

Similarly, a second surface acoustic wave filter device 13 is positioned over and is secured to both a portion of output signal area 7 and a portion of output ground area 11, as shown in FIG. 2. In this arrangement the input transducer of this second device, constituted of input signal electrode 22 and input ground electrode 23, of this SAW filter device is located closer to the output portion of fourth area (input signal path area) 9 than the output transducer of the same device, constituted of output ground electrode 26 and output signal electrode 27.

A device ground shield 50, as shown in FIG. 2, may be located between and thereby separate the transducers of this SAW filter device and may be electrically connected to the sixth area (output ground area) 11 at both sides of this device ground shield.

Electrical connection of each of the electrodes of each transducer to the appropriate respective conductive area of the surface of the substrate is effected by means of thin bent electrically-conductive metallic strap leads. Each strap lead includes a bend effective for accommodating any motion resulting from temperature changes. The strap leads have a non-cylindrical cross-sectional configuration which it is believed provides lower impedance and less radiation than a cylindrical cross-section wire configuration. Reduced radiation effects increases the isolation of the two devices. While a non-cylindrical cross-sectional electrical connector is preferred, it is not required.

The first SAW filter device 12 includes input signal transducer electrode pair 14, 15. Input signal electrode 14 is electrically connected to the input signal or first area 6 by means of a bent wire strap 16, and input ground electrode 15 is electrically connected to input ground area or second area 10 by means of a strap 17. Similarly, for the device 12 includes an output electrode pair 18, 19. Output signal electrode 18 is electrically connected to the input portion of the signal path area or fourth area 9 by means of a bent wire strap 20, and output ground electrode 19 is electrically connected to input ground area or fifth area 10 by means of a bent wire strap 21.

The second SAW filter device 13 includes an input electrode pair 22, 23. Input signal electrode 22 is electrically connected to the output portion of the signal path area or fourth area 9 by means of a bent wire strap 24, and input ground electrode 23 is electrically connected to the output ground area or sixth area 11 by means of a bent wire strap 25. Similarly, for the device 13 includes an output electrode pair 26, 27. Output signal electrode 27 is electrically connected to the output area or second area 7 by means of a bent wire strap 28, and output ground electrode 26 is electrically connected to the output ground area or sixth area 11 by means of a bent wire strap 29.

A chip shunt inductor 30 is provided to couple the SAW filter devices of the pass-band filter for the in-line multi-stage SAW filter devices as a whole. The pass-band filter is provided to meet a number of specifications including low cost, small size, temperature stability, low insertion loss (that is, the loss through the combined filter configuration), fairly wide band-pass, and high selectivity (that is, high attenuation of unwanted frequencies). By use of an electrical equivalent model of the series combination of SAW filter devices, it has been determined that a design configuration wherein a coupling shunt inductor is connected between an intermediate portion of fourth area 9 and third area 8 improves the electrical performance of the combined filter configuration in the above-noted desired manner. In particular, it has been determined that the inductor has the largest effect on the pass-band width and insertion loss. In short, the coupling shunt inductor 30 between the SAW filter devices helps to reduce loss within the pass-band of the combined filter. The chip shunt inductor therefore provides a compact implementation that is easily adaptable to IC manufacturing techniques.

In order to further increase isolation between the two in-line SAW filter devices, a ground shield 31 may be secured to and make electrical contact with the ground shield area or third area 8. The ground shield 31 is usually vertically oriented, is formed of electrically conductive material, and and is physically taller and wider than either of the SAW filter devices such as to be effective in blocking unwanted radiative signals from being received by the later stage SAW filter device. The ground shield 31 serves also to reduce crosstalk between the leads of the different SAW filter resonator devices.

The third area 8 may be coated with a conductive adhesive such as to cause the ground shield 31 mounted thereon to adhere thereto. Alternatively, the metal shield 31 can be previously inserted into or mechanically attached to the inside of an insulative cover 32, preferably formed of ceramic material. The metallic shield 31 and cover 32 can then both be mated to the third area 8 and substrate 1, respectively, in a single automated manufacturing operation. Sealing the cover 32 to the substrate 1 must not short the signal to any ground. The shield 31 can be previously "tinned" with solder. If heat is then applied to the shield prior to the mating of the cover/shield assembly to the substrate, the mating process will result in soldering of the shield to the third area of the surface of the substrate. Attachment of the cover to the substrate must be by a non-conducting, preferably low out-gassing material, but might not itself need be hermetic if the cover device can be conformingly coated later to provide hermeticity.

Cover 32 preferably covers over the plurality of SAW devices and associated circuitry and is secured to the substrate, but also preferably allows convenient electrical contact with various conductive areas or leads extending out from beneath the cover including the various input and output areas as shown in FIG. 2. As seen in FIG. 2, the printed leads extend to the terminal side of the surface of the substrate and are exposed beyond the area covered. This eliminates the need for costly and complex feedthroughs inasmuch as the cover of the filter assembly module does not extend completely over the entire terminal side of the substrate and thus electrical connections can be made to the various conductive lead areas in a convenient manner allowing them to serve as terminal contact locations. When a completed device is used in a circuit or other application, the ground areas 10, 8, 11 are preferably connected to a common external ground point or terminal located off of the device.

Thus, it will be seen that in a SAW filter assembly module comprising a plurality of series in-line SAW filter devices, provision of separate isolated ground areas for each SAW filter device with a separate inter-SAW ground area provided between each set of device ground areas with the conductive input area of a first SAW filter located most distant from the conductive output area of a subsequent SAW filter with the plurality of conductive ground areas therebetween between increases isolation and selectivity. Use of a conductive shield secured to and electrically connected to the inter-SAW ground area which is positioned to block radiative signals between the devices adds to the effectiveness of the isolation and the effectiveness of this inter-SAW ground area.

Note that although the figures show only the SAW filter assembly module on the ceramic substrate, the associated conductive pattern might merely be one functional area of a larger hybrid circuit substrate with the printed SAW conductive leads making direct connection to other electrical components.

It will be apparent that many modifications and variations could be effected by one skilled in the art without departing from the spirit or scope of the novel concepts of the present invention, so that the scope of the invention should be determined by the appended claims.

What I claim as new and desire to secure by Letters Patent of the United States is:

1. A method of manufacturing a filter assembly module including a pair of adjacent surface acoustic wave (SAW) filter devices each having input signal, input ground, output signal and output ground electrodes, whereby substantial isolation between the input signal and the output signal of the module and electrical contacts for associated circuitry are provided comprising:

a. applying electrically conductive material in a pattern of a plurality of discrete mutually isolated areas on a surface of an insulative substrate having oppositely disposed input and output ends, and oppositely disposed terminal and non-terminal sides such that:

1. a first area is located adjacent the input end and the terminal side of said surface;

2. a second area is located adjacent the output end and the terminal side of said surface;

3. a third area is located between said first and second areas and includes a portion adjacent the terminal side of said surface;
4. a fourth area is located between said third area and said non-terminal side of said surface and includes oppositely disposed input and output portions and an intermediate portion;
5. a fifth area is located between said first and third areas and includes a portion adjacent said terminal side of said surface;
6. a sixth area is located between said second and third areas and includes a portion adjacent said terminal side of said surface;

b. placing a first surface acoustic wave filter device over a portion of the conductive material on each of said first and fifth areas and securing the device thereto;

c. placing a second surface acoustic wave filter device over a portion of the conductive material on each of said second and sixth areas and securing the device thereto;

d. electrically connecting the first area to the input signal electrode; the fifth area to the input ground electrode; the input portion of the fourth area to the output signal electrode; and the fifth area to the output ground electrode of said first surface acoustic wave filter device;

e. electrically connecting the output portion of said fourth area to said input signal electrode, said sixth area to said input ground electrode, said sixth area to said output ground electrode, and said second area to said output signal electrode of said second surface acoustic wave filter device;

f. electrically connecting and mechanically securing a metallic shield to said third area and positioning said shield between said surface acoustic wave filter devices for blocking radiative signals therebetween; and g. electrically connecting a coupling inductor between said third area and said intermediate portion of said fourth area to provide low insertion loss and high selectivity for said filter assembly module.

2. The method of claim 1, further comprising pretinning an edge of said shield with solder, supporting said shield in a predetermined position in an insulative module cover, heating said shield, and then placing said cover on the surface of said substrate with the pretinned edge of said shield contacting said third area for securing and electrically connecting said shield to said third area.

3. A method of manufacturing a filter assembly module including a pair of adjacent surface acoustic wave (SAW) filter devices each having input signal, input ground, output signal and output ground electrodes, whereby substantial isolation between the input signal and the output signal of the module and electrical contacts for associated circuitry are provided comprising:

a. applying electrically conductive material in a pattern of a plurality of discrete mutually isolated areas on a surface of an insulative substrate having oppositely disposed input and output ends, and oppositely disposed terminal and non-terminal sides such that:
1. a first area is located adjacent the input end;
2. a second area is located adjacent the output end;
3. a third area is located between said first and second areas and includes a portion adjacent the terminal side of said surface;
4. a fourth area is located between said third area and said non-terminal side of said surface and includes oppositely disposed input and output portions and an intermediate portion;
5. a fifth area is located between said first and third areas and includes a portion adjacent said terminal side of said surface;
6. a sixth area is located between said second and third areas and includes a portion adjacent said terminal side of said surface;

b. placing a first surface acoustic wave filter device over a portion of the conductive material on each of said first and fifth areas and securing the device thereto;

c. placing a second surface acoustic wave filter device over a portion of the conductive material on each of said second and sixth areas and securing the device thereto;

d. electrically connecting the first area to the input signal electrode; the fifth area to the input ground electrode; the input portion of the fourth area to the output signal electrode; and the fifth area to the output ground electrode of said first surface acoustic wave filter device;

e. electrically connecting the output portion of said fourth area to said input signal electrode, said sixth area to said input ground electrode, said sixth area to said output ground electrode, and said second area to said output signal electrode of said second surface acoustic wave filter device;

f. electrically connecting and mechanically securing a metallic shield to said third area and positioning said shield between said surface acoustic wave filter devices for blocking radiative signals therebetween; and g. electrically connecting a coupling inductor between said third area and said intermediate portion of said fourth area to provide low insertion loss and high selectivity for said filter assembly module.

4. A surface acoustic wave (SAW) filter assembly module including improved isolation means comprising:
a. an insulative substrate having oppositely disposed input and output ends and oppositely disposed terminal and non-terminal sides;
b. a plurality of discrete mutually isolated electrically conductive areas on a surface of said substrate including:
1. a first area located adjacent the input end and said terminal side of said surface;
2. a second area located adjacent the output end and said terminal side of said surface;
3. a third area located between said first and second areas and including a portion thereof adjacent said terminal side of said surface;
4. a fourth area located between said third area and said non-terminal side of said surface and including oppositely disposed input and output portions and an intermediate portion;
5. a fifth area located between said first and third areas and including a portion adjacent said terminal side of said surface;
6. a sixth area located between said second and third areas and including a portion adjacent said terminal side of said surface;

c. first and second surface acoustic wave filter devices, each having input and output signal electrodes and input and output ground electrodes; said first device being positioned over and secured to each of said first and fifth areas; said second device being positioned over and secured to each of said second and sixth areas;

d. means electrically connecting:
  1. said first area to said input signal electrode;
  2. said fifth area to said input ground electrode;
  3. said input portion of said fourth area to said output signal electrode;
  4. said fifth area to said output ground electrode of said first device;

e. means electrically connecting;
  1. said sixth area to said input ground electrode;
  2. said output portion of said fourth area to said input signal electrode;
  3. said sixth area to said output ground electrode;
  4. said second area to said output signal electrode of said second device; and f. an electrically conductive shield electrically connected to said third area and positioned between said devices for blocking radiative signals therebetween.

5. The invention of claim 4, wherein the means electrically connecting said areas and the electrodes of said devices are bent to accommodate motion resulting from temperature changes.

6. The invention of claim 4 or claim 5, wherein the means for electrically connecting said areas and the electrodes of said devices are conductive straps of non-cylindrical cross-section.

7. The module of claim 4, further comprising an insulative cover, said cover covering over and secured to a portion of said substrate, said portion not extending to said terminal side of said substrate so that a portion of all conductive areas other than said fourth conductive area are disposed beyond the area covered to permit convenient electrical contact.

8. The invention of claim 4, or claim 5, or claim 7, further comprising a coupling inductor electrically connected between said third area and said intermediate portion of said fourth area, said inductor providing low insertion loss and high selectivity for said filter assembly module.

9. The invention of claim 8, wherein said coupling inductor is a chip inductor.

10. The invention of claim 8, wherein said coupling inductor is of a type suitable for placement and electrical connection by standard integrated circuit automated machinery.

* * * * *